(12) United States Patent
Ishikida

(10) Patent No.: US 10,483,308 B2
(45) Date of Patent: Nov. 19, 2019

(54) REDUCING THICKNESS OF MODULE IN SOLID STATE IMAGING DEVICE

(71) Applicant: SONY CORPORATION, Tokyo (JP)

(72) Inventor: Masayuki Ishikida, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/276,968

(22) Filed: Sep. 27, 2016

(65) Prior Publication Data

US 2017/0018589 A1 Jan. 19, 2017

Related U.S. Application Data

(63) Continuation of application No. 13/461,910, filed on May 2, 2012, now Pat. No. 9,472,585.

(30) Foreign Application Priority Data

May 11, 2011 (JP) .................. 2011-105993

(51) Int. Cl.
*H01L 27/146* (2006.01)

(52) U.S. Cl.
CPC .. *H01L 27/14625* (2013.01); *H01L 27/14618* (2013.01); *H01L 27/14636* (2013.01); *H01L 27/14638* (2013.01); *H01L 27/14685* (2013.01); *H01L 2224/48091* (2013.01); *H01L 2224/48227* (2013.01)

(58) Field of Classification Search
CPC ......... H01L 27/14618; H01L 27/14636; H01L 23/06; H01L 23/492; H01L 27/14625; H01L 27/14638; H01L 27/14685
See application file for complete search history.

(56) References Cited

U.S. PATENT DOCUMENTS

| | | |
|---|---|---|
| 4,034,394 A | 7/1977 | Kamo et al. |
| 5,063,435 A | 11/1991 | Okamoto et al. |
| 5,676,442 A | 10/1997 | Fujimori |
| 7,004,589 B2 | 2/2006 | Shimizu |
| 7,014,324 B2 | 3/2006 | Jang |
| 8,537,288 B2 | 9/2013 | Hayashi et al. |
| 2002/0019081 A1* | 2/2002 | Denis ............... H01L 29/66765 438/149 |
| 2002/0074545 A1* | 6/2002 | Hosier ............... H01L 22/34 257/48 |
| 2002/0089039 A1* | 7/2002 | Wu ............... H01L 23/053 257/600 |
| 2002/0089612 A1 | 7/2002 | Takehiro et al. |
| 2004/0195492 A1 | 10/2004 | Hsin et al. |
| 2005/0213059 A1 | 9/2005 | Liu et al. |

(Continued)

FOREIGN PATENT DOCUMENTS

| | | |
|---|---|---|
| JP | 59-158570 A | 9/1984 |
| JP | 63-177446 A | 7/1988 |

(Continued)

*Primary Examiner* — Tucker J Wright
(74) *Attorney, Agent, or Firm* — Chip Law Group

(57) ABSTRACT

A semiconductor package includes: a sheet-like thin plate on which a semiconductor chip is secured; and a substrate including a wiring layer, disposed on the thin plate to extend over a part of a region surrounding the region where the semiconductor chip is secured or over the entire surrounding region, wherein the semiconductor chip and the substrate are electrically connected.

18 Claims, 3 Drawing Sheets

(56) References Cited

U.S. PATENT DOCUMENTS

| | | | |
|---|---|---|---|
| 2010/0218985 A1* | 9/2010 | Kouya | ............... H01L 23/142 |
| | | | 174/260 |
| 2010/0314703 A1 | 12/2010 | Chen et al. | |
| 2012/0120373 A1 | 5/2012 | Koyama | |
| 2012/0155854 A1 | 6/2012 | Huang et al. | |

FOREIGN PATENT DOCUMENTS

| | | |
|---|---|---|
| JP | 04-024947 A | 1/1992 |
| JP | 2001-127237 A | 5/2001 |
| JP | 2004-173028 A | 6/2004 |
| JP | 2004-349369 A | 12/2004 |
| JP | 2008-187554 A | 8/2008 |
| JP | 2011-002611 A | 1/2011 |

\* cited by examiner

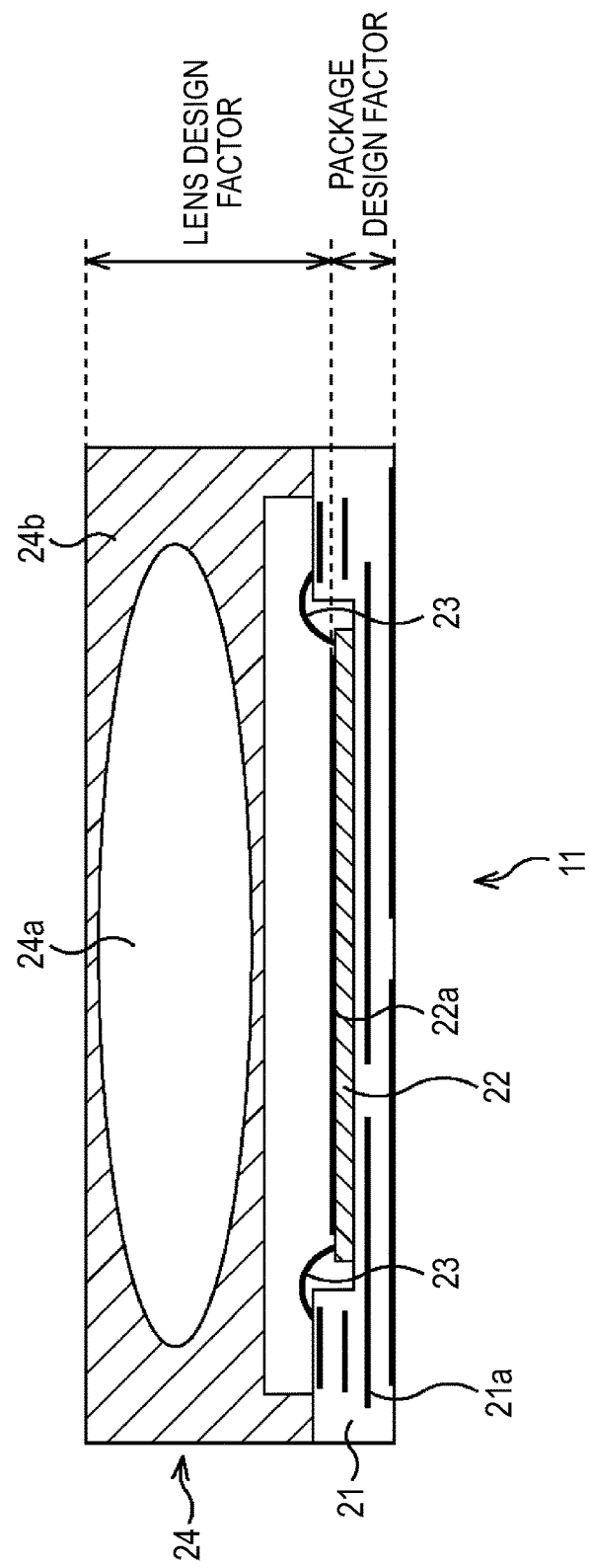

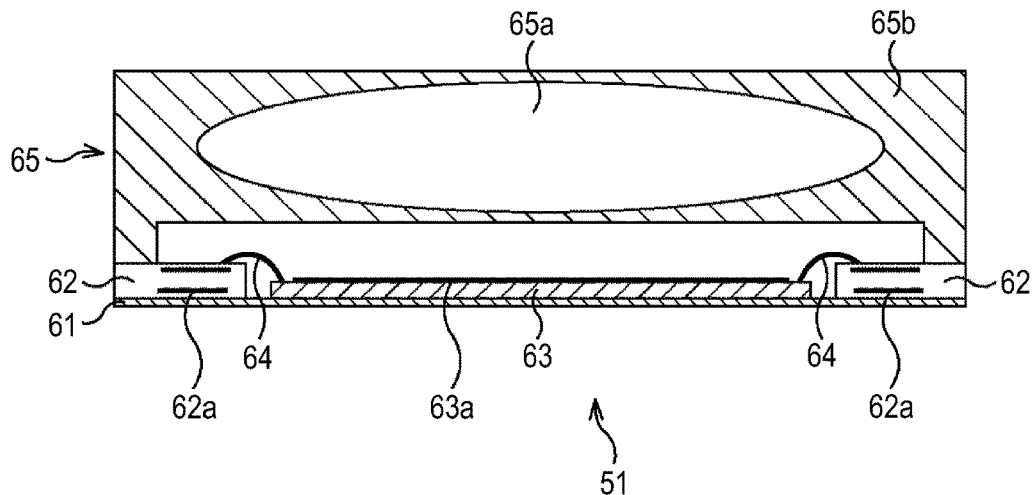
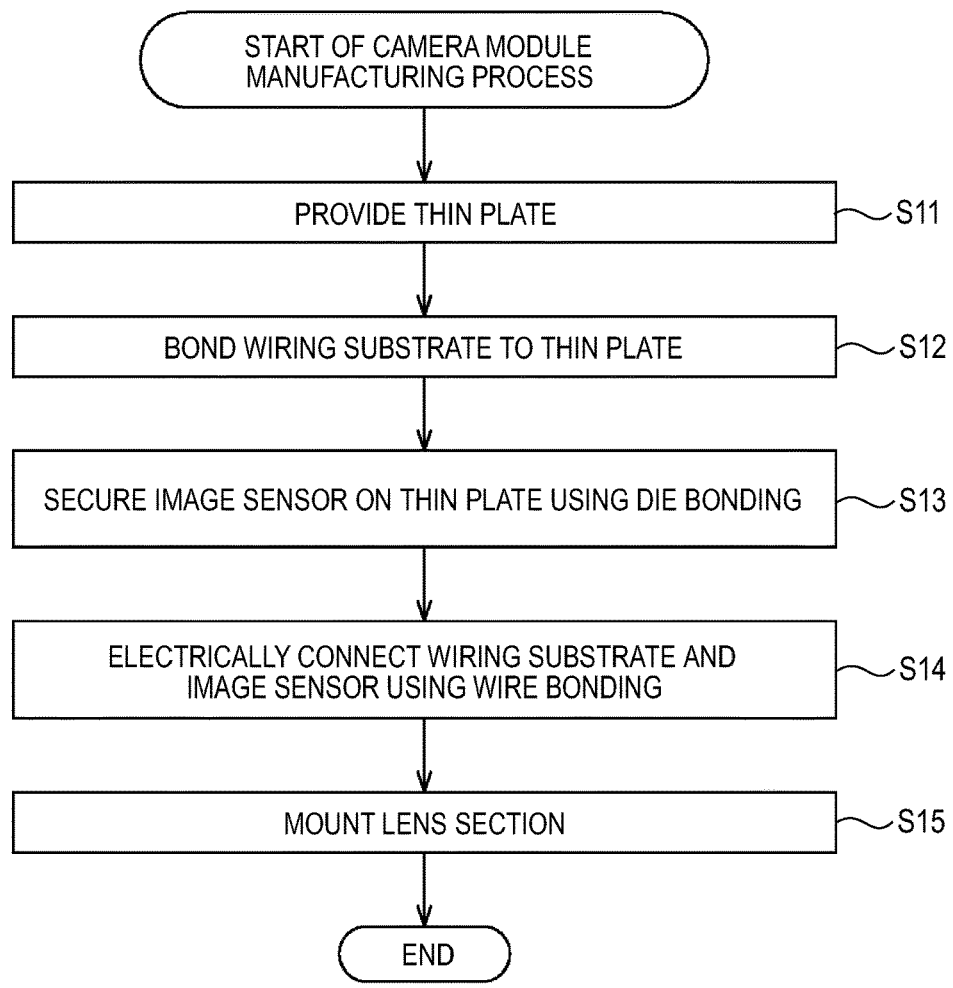

REDUCING THICKNESS OF MODULE IN SOLID STATE IMAGING DEVICE

CROSS REFERENCE TO RELATED APPLICATION

The present application is a continuation application of U.S. patent application Ser. No. 13/461,910, filed May 2, 2012, which claims the benefit of priority from prior Japanese Priority Patent Application JP 2011-105993 filed in the Japan Patent Office on May 11, 2011, the entire content of which is hereby incorporated by reference.

FIELD

The present disclosure relates to a semiconductor package, a semiconductor device manufacturing method, and a solid-state imaging device. More, particularly, the present disclosure relates to a semiconductor package, a semiconductor device manufacturing method, and a solid-state imaging device which make it possible to provide a module having a smaller thickness.

BACKGROUND

According to the related art, an image sensor is packaged by securing it on a substrate through die bonding, and substrates used for such a purpose include substrates in the form of flat plates and substrates formed such that a cavity is provided above a light receiving surface of an image sensor (for example, see JP-A-2003-218333 and JP-A-2003-250072 (Patent Documents 1 and 2)). Ceramic substrates, organic substrates (rigid substrates and flexible substrates) are commonly used as substrates as described above.

A substrate forming a part of a package as thus described has the function of supporting an image sensor and the function of bearing wirings for the image sensor. In order to perform the former function, it is desirable for the substrate to have a great thickness from the viewpoint of strength. In order to provide the latter function, a multi-layer structure including two or more layers is commonly used as a wiring layer. The thickness of the substrate increases with the number of layers. Generally speaking, a substrate including a wiring layer having a two-layer structure has a thickness of 0.1 mm or more, and a substrate including a wiring layer having a four-layer structure has a thickness of 0.2 mm or more.

SUMMARY

Demand for image sensor packages having smaller thicknesses is on increase as a result of the recent trend toward lighter and smaller final products in which such packages are to be set.

FIG. 1 is a sectional view of a camera module 11 according to the related art.

The camera module 11 shown in FIG. 1 includes wiring substrate 21, an image sensor 22, wires 23, and a lens unit 24.

The wiring substrate 21 includes a wiring layer of a multi-layer structure having a plurality of wiring patterns 21a, and an image sensor 22 is secured on the wiring substrate 21 through die bonding. The wiring substrate 21 is formed such that a cavity is provided above a light receiving surface 22a of the image sensor 22. The wiring substrate 21 and the image sensor 22 are electrically connected through the wires 23 using wire bonding. The lens unit 24 is formed by a lens 24a and a support portion 24b, and the support portion 24b supports the lens 24a above the wiring substrate 21, the lens 24a allowing light to impinge on the light receiving surface 22a of the image sensor 22.

The thickness of such a camera module 11 may be regarded as separated into the thickness of a lens design factor ranging from the light receiving surface 22a of the image sensor 22 up to a top surface of the lens unit 24 and the thickness of a package design factor ranging from the light receiving surface 22a of the image sensor 22 down to a bottom surface of the wiring substrate 21.

When the camera module 11 is to be provided with a smaller thickness with the lens design factor or the optical system kept unchanged, the thickness of the package design factor must be reduced.

Then, what is to be examined is the possibility of a reduction in the thickness of the wiring substrate 21. When the wiring substrate 21 is a ceramic substrate, the wiring substrate 21 is more liable to crack, the smaller the thickness of the substrate. When the wiring substrate 21 is an organic substrate, the wiring substrate 21 is more liable to twist or warp, the smaller the thickness of the substrate.

As thus described, there has been a limit to the reduction in the thickness of a camera module achievable through a reduction in the thickness of a substrate according to the related art used in the module.

Under the circumstance, it is desirable to reduce the thickness of a module.

An embodiment of the present disclosure is directed to a semiconductor package including a sheet-like thin plate on which a semiconductor chip is secured and a substrate including a wiring layer, disposed on the thin plate to extend over a part of a region surrounding the region where the semiconductor chip is secured or over the entire surrounding region, wherein the semiconductor chip and the substrate are electrically connected.

The thin plate may be formed of a metal.

The thin plate may be formed of stainless steel.

The thin plate may be formed of a metal having high thermal conductivity.

The thin plate may be formed by laminating a layer of stainless steel and a layer of a metal having high thermal conductivity.

The thin plate and the substrate may be electrically connected.

Another embodiment of the present disclosure is directed to a method of manufacturing a semiconductor device including: securing a semiconductor chip on a sheet-like thin plate; disposing a substrate including a wiring layer on the thin plate such that the substrate extends over a part of a region surrounding the region where the semiconductor chip is secured or over the entire surrounding region; and electrically connecting the semiconductor chip and the substrate.

Still another embodiment of the present disclosure is directed to a solid-state imaging device including a lens, an image sensor photo-electrically converting light collected by the lens, a sheet-like thin plate on which the image sensor is secured, and a substrate including a wiring layer, disposed on the thin plate to extend over a part of a region surrounding the region where the image sensor is secured or over the entire surrounding region, wherein the image sensor and the wiring substrate are electrically connected.

In one embodiments of the present disclosure, a semiconductor chip is secured on a sheet-like thin plate; a substrate including a wiring layer is disposed on the thin plate such that the substrate extends over a part of a region surrounding the region where the semiconductor chip is secured or over the entire surrounding region; and the semiconductor chip and the substrate are electrically connected.

According to the embodiments of the present disclosure, a module having a small thickness can be provided.

BRIEF DESCRIPTION OF THE DRAWINGS

FIG. 1 is a sectional view of a camera module according to the related art;

FIG. 2 is a sectional view of a camera module to which the present disclosure is applied;

FIG. 3 is a flow chart for explaining a process of manufacturing a camera module.

DETAILED DESCRIPTION

Figure 4A:
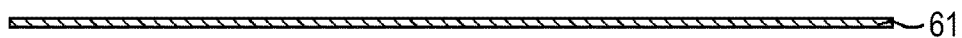
FIGS. 4A to 4E are illustrations showing steps for manufacturing a camera module.

An embodiment of the present disclosure will now be described with reference to the drawings. The following items will be described in the order listed.
1. Configuration of Camera Module
2. Steps of Manufacturing Camera Module
<1. Configuration of Camera Module>

FIG. 2 is a sectional view of an embodiment of the present disclosure, i.e., a camera module 51 which is a solid-state imaging device to which the present disclosure is applied.

The camera module 51 includes a thin plate 61, a wiring substrate 62, an image sensor 63, wires 64, and a lens unit 65.

For example, the thin plate 61 is constituted by sheet metal. Specifically, the thin plate 61 is formed of an SUS (steel use stainless) type metal or a metal having high thermal conductivity such as Al or Cu, and the plate has a thickness of about 0.1 mm. The thin plate 61 may be formed of one type of metal as thus described, and the plate may alternatively be formed by laminating an SUS metal and a metal having high thermal conductivity.

The image sensor 63 is secured on the thin plate 61 using die bonding. The wiring substrate 62 is disposed on the thin plate 61 around the region where the image sensor 63 is secured, and the substrate is secured to the plate so as to surround the image sensor 63. The wiring substrate 62 includes a wiring layer having a multi-layer structure, the wiring layer including a plurality of wiring patterns 62a. The wiring substrate 62 may be disposed throughout the region of the thin plate 61 surrounding the region where the image sensor 63 is secured, and the substrate may alternatively be disposed to cover only a part of the surrounding region.

The image sensor 63 has a light receiving surface 63a in which unit pixels each including a photoelectric conversion element (the unit pixels may hereinafter be simply referred to as "pixels") are two-dimensionally arranged in the form of a matrix. The sensor detects the amount of electrical charge as a physical quantity generated at each pixel in accordance with the quantity of light incident on the light receiving surface 63a. The wiring substrate 62 and the image sensor 63 are electrically connected through the wires 64 using wire bonding.

The lens unit 65 is formed by a lens 65a and a support portion 65b, and the support portion 65b supports the lens 65a above the wiring substrate 62, the lens 65a allowing light to impinge on the light receiving surface 63a of the image sensor 63.

In such a camera module 51, the range from the light receiving surface 63a of the image sensor up to the top surface of the lens unit 65 constitutes a lens design factor, and the range from the light receiving surface 63a of the image sensor 63 down to the bottom surface of the thin plate 61 constitutes a package design factor, i.e., an image sensor package.

<2. Steps of Manufacturing Camera Module>

Steps for manufacturing a camera module 51 will now be described with reference to FIG. 3 and FIGS. 4A to 4E. FIG. 3 is a flow chart for explaining a flow of a process of manufacturing a camera module 51, and FIGS. 4A to 4E are illustrations showing steps for manufacturing the camera module 51.

At step S11, a thin plate 61 is provided as shown in FIG. 4A.

Figure 4B:
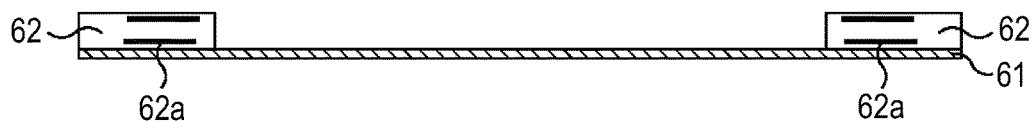

At step S12, a wiring substrate 62 is connected to the thin plate 61 as shown in FIG. 4B. At this time, the thin plate 61 and the wiring substrate 62 may be electrically connected after grounding the thin plate 61. Thus, the electrical characteristics and shielding performance of the wiring substrate 62 can be improved.

Figure 4C:
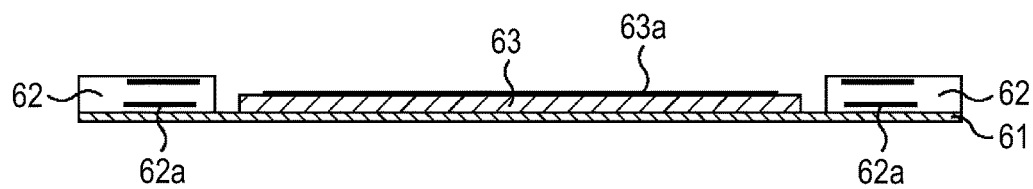

At step S13, an image sensor 63 is secured on the thin plate 61 using die bonding as shown in FIG. 4C.

The bonding material used for die bonding may be either material having insulating properties or conductive material. For example, when a material having insulating properties is used as the bonding material, insulation can be established between the thin plate 61 and a silicon substrate of the image sensor 63. When wire bonding is carried out using a conductive material as the bonding material after grounding the thin plate 61, the silicon substrate of the image sensor 63 may be grounded. Either material having insulating properties or conductive material may be used as the bonding material for die bonding depending on the characteristics of the image sensor 63 as thus described.

Figure 4D:
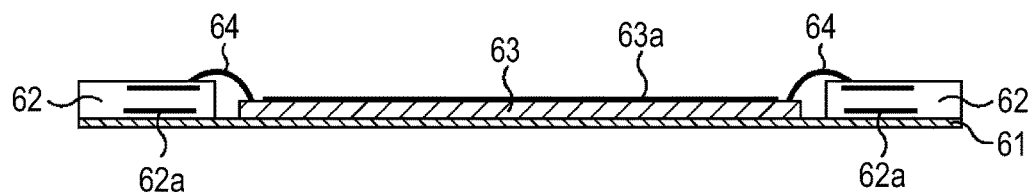
Figure 4E:
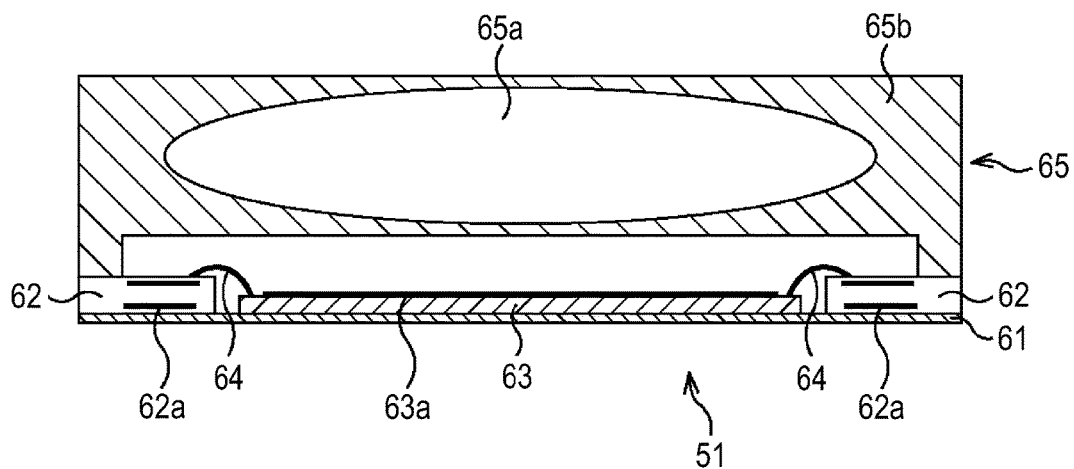

At step s14, the wiring substrate 62 and the image sensor 63 are electrically connected through wires 64 using wire bonding, as shown in FIG. 4D. Bonding methods other than wire bonding may be used as long as the wiring substrate 62 and the image sensor 63 are connected.

At step S15, a lens unit 65 is placed on the wiring substrate 62. Thus, a camera module 51 is completed.

In the configuration and process described above, the image sensor 63 is secured on the thin plate 61 having no wiring layer, and the wiring substrate 62 including a wiring layer is disposed around the image sensor 63. An image sensor package formed as thus described can be provided with a thickness which is smaller by an amount equivalent to the thickness of the wiring layer compared to the thickness of a package having an ordinary configuration according to the related art in which an image sensor is secured on a wiring substrate including a wiring layer. Consequently, a camera module having a small thickness can be provided.

Since the thin plate 61 is formed of a metal, the strength of the image sensor package can be sufficiently kept even if the package is provided with a small thickness.

Further, when the thin plate 61 is formed of an SUS type metal, an image sensor package having high rigidity can be provided without performing a rust-preventing process.

When the thin plate 61 is formed of a metal having high thermal conductivity such as Al or Cu, it is possible to provide an image sensor package which allows heat released by the image sensor 63 to be efficiently released from the bottom surface of the image sensor 63 to the outside through the thin plate 61.

Further, when the thin plate 61 is formed by laminating a layer of an SUS type metal and a layer of a metal having high thermal conductivity such as Al or Cu, an image sensor package having the above-described two advantages can be provided.

Since the thin plate 61 and the wiring substrate 62 are provided as separate elements, the thin plate 61 and the wiring substrate 62 can be formed using materials having characteristics appropriate for the respective purposes of the elements. Specifically, characteristics desirable for the wiring substrate 62 can be obtained by using a substrate according to the related art such as a ceramic substrate or organic substrate as the wiring substrate. The thin plate 61 may be made of a material which provides high strength or rigidity even if it has a small thickness. Thus, the plate can be provided with strength or rigidity at a level hard to achieve with a ceramic material or organic material which is optimal as the material of the wiring substrate.

According to the above description, the thin plate 61 is formed of a metal. Alternatively, the plate may be formed of a non-metal material as long as sufficient strength or rigidity can be obtained.

While an exemplary application of the present disclosure to an image sensor package has been described, the present disclosure may be applied to a semiconductor package formed by packaging a predetermined semiconductor chip. Specifically, the present disclosure allows a semiconductor package to be provided with a small thickness, which consequently makes it possible to provide a semiconductor device (semiconductor module) including such a semiconductor package with a small thickness.

The present disclosure is not limited to the above-described embodiment, and various modifications may be made without departing from the spirit of the present disclosure.

The present disclosure may be implemented as the configurations described below.

(1) A semiconductor package including:
a sheet-like thin plate on which a semiconductor chip is secured; and
a substrate including a wiring layer, disposed on the thin plate to extend over a part of a region surrounding the region where the semiconductor chip is secured or over the entire surrounding region, wherein
the semiconductor chip and the substrate are electrically connected.

(2) The semiconductor package according to the item (1), wherein the thin plate may be formed of a metal.

(3) The semiconductor package according to the item (2), wherein the thin plate may be formed of stainless steel.

(4) The semiconductor package according to the item (2), wherein the thin plate may be formed of a metal having high thermal conductivity.

(5) The semiconductor package according to the item (2), wherein the thin plate may be formed by laminating a layer of stainless steel and a layer of a metal having high thermal conductivity.

(6) The semiconductor package according to any of the items (2) to (5), wherein the thin plate and the substrate may be electrically connected.

(7) A method of manufacturing a semiconductor device including:
securing a semiconductor chip on a sheet-like thin plate;
disposing a substrate including a wiring layer on the thin plate such that the substrate extends over a part of a region surrounding the region where the semiconductor chip is secured or over the entire surrounding region; and
electrically connecting the semiconductor chip and the wiring substrate.

(8) A solid-state imaging device including:
a lens;
an image sensor photo-electrically converting light collected by the lens;
a sheet-like thin plate on which the image sensor is secured; and
a substrate including a wiring layer, disposed on the thin plate to extend over a part of a region surrounding the region where the image sensor is secured or over the entire surrounding region, wherein
the image sensor and the wiring substrate are electrically connected.

The present disclosure contains subject matter related to that disclosed in Japanese Priority Patent Application JP 2011-105993 filed in the Japan Patent Office on May 11, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A camera module, comprising:
a metal plate;
an image sensor on the metal plate;
a wiring substrate on the metal plate, wherein
the wiring substrate includes a plurality of wiring layers,
the wiring substrate comprises one of a ceramic material or organic material,
the metal plate comprises copper,
the metal plate has no wiring layer of the plurality of wiring layers,
the wiring substrate is in contact with the metal plate,
the wiring substrate extends entirely over a first region of the metal plate that surrounds a second region of the metal plate,
the image sensor is on the second region,
the image sensor is electrically connected to the wiring substrate,
the wiring substrate includes a first edge and a second edge, and
the wiring substrate is on the metal plate such that a width between the first edge and the second edge of the wiring substrate is equal to a width of the metal plate in a sectional view; and
a lens unit on the wiring substrate.

2. The camera module according to claim 1, wherein the lens unit is above the metal plate such that a width of the lens unit is equal to the width between the first edge and the second edge of the wiring substrate.

3. The camera module according to claim 1, wherein a wiring layer of the plurality of wiring layers includes a plurality of wiring patterns.

4. The camera module according to claim 1, wherein the plurality of wiring layers is a multi-layer structure.

5. The camera module according to claim 1, wherein the image sensor comprises a plurality of pixels.

6. The camera module according to claim 1, wherein
the image sensor is bonded to a surface of the metal plate by a bonding material, and
the bonding material is an insulating material.

7. The camera module according to claim 1, wherein
the image sensor is bonded to a surface of the metal plate by a bonding material, and
the bonding material is a conductive material.

8. The camera module according to claim 1, wherein the metal plate has a thickness of 0.1 mm.

9. The camera module according to claim 1, wherein the image sensor is connected to the metal plate.

10. An electronic apparatus, comprising:
a camera module that comprises:
a metal plate;
an image sensor on the metal plate;
a wiring substrate on the metal plate, wherein
the wiring substrate includes a plurality of wiring layers,
the wiring substrate comprises one of a ceramic material or organic material,
the metal plate comprises copper,
the metal plate has no wiring layer of the plurality of wiring layers,
the wiring substrate is in contact with the metal plate,
the wiring substrate extends entirely over a first region of the metal plate that surrounds a second region of the metal plate,
the image sensor is on the second region,
the image sensor is electrically connected to the wiring substrate,
the wiring substrate includes a first edge and a second edge, and
the wiring substrate is on the metal plate such that a width between the first edge and the second edge of the wiring substrate is equal to a width of the metal plate in a sectional view; and
a lens unit on the wiring substrate.

11. The electronic apparatus according to claim 10, wherein the lens unit is above the metal plate such that a width of the lens unit is equal to the width between the first edge and the second edge of the wiring substrate.

12. The electronic apparatus according to claim 10, wherein a wiring layer of the plurality of wiring layers includes a plurality of wiring patterns.

13. The electronic apparatus according to claim 10, wherein the plurality of wiring layers is a multi-layer structure.

14. The electronic apparatus according to claim 10, wherein the image sensor comprises a plurality of pixels.

15. The electronic apparatus according to claim 10, wherein
the image sensor is bonded to a surface of the metal plate by a bonding material, and
the bonding material is an insulating material.

16. The electronic apparatus according to claim 10, wherein
the image sensor is bonded to a surface of the metal plate by a bonding material, and
the bonding material is a conductive material.

17. The electronic apparatus according to claim 10, wherein the metal plate has a thickness of about 0.1 mm.

18. The electronic apparatus according to claim 10, wherein the image sensor is connected to the metal plate.

* * * * *